United States Patent [19]

Batts

[11] Patent Number: 4,652,833

[45] Date of Patent: Mar. 24, 1987

[54] COMPARATOR WITH NOISE SUPPRESSION

[75] Inventor: Colossie N. Batts, Newport News, Va.

[73] Assignee: The United States of America as represented by the Administrator of the National Aeronautics and Space Administration, Washington, D.C.

[21] Appl. No.: 683,101

[22] Filed: Dec. 18, 1984

[51] Int. Cl.4 ........................ H03K 5/153; H03K 5/08
[52] U.S. Cl. ..................................... 328/147; 307/354; 307/261; 328/28; 328/164
[58] Field of Search .................... 307/247 A, 350, 362, 307/354, 261, 273, 290; 328/28, 146, 147, 164

[56] References Cited

U.S. PATENT DOCUMENTS 3,593,162 7/1971 Patmore .
3,612,912 10/1971 Schwartz ............................ 307/290
3,737,790 6/1973 Brown .
3,842,291 10/1974 Maringer .
3,979,683 9/1976 Ikeda .
4,358,738 11/1982 Kahn .
4,480,200 10/1984 Tan et al. ............................ 307/354

*Primary Examiner*—John Zazworsky
*Attorney, Agent, or Firm*—George F. Helfrich; John R. Manning; Robert D. Marchant

[57] ABSTRACT

Apparatus for generating a single pulse the first time only that a noisy cyclic signal exceeds a reference level during a half-cycle. For the positive half of a cycle of the noisy cyclic signal, a comparator 12 and a multivibrator 14 produces a fixed voltage output when the noisy cyclic signal first exceeds the reference level. A multivibrator 23 stops the production of the fixed voltage output when the noisy cyclic signal next passes the zero voltage level in the negative direction. Consequently, a single pulse is generated indicating that the signal exceeded the reference level during that half-cycle. Comparator 16 and multivibrator 17 are for producing pulses whenever the noisy cyclic signal exceeds the reference level during the negative half-cycle.

10 Claims, 1 Drawing Figure

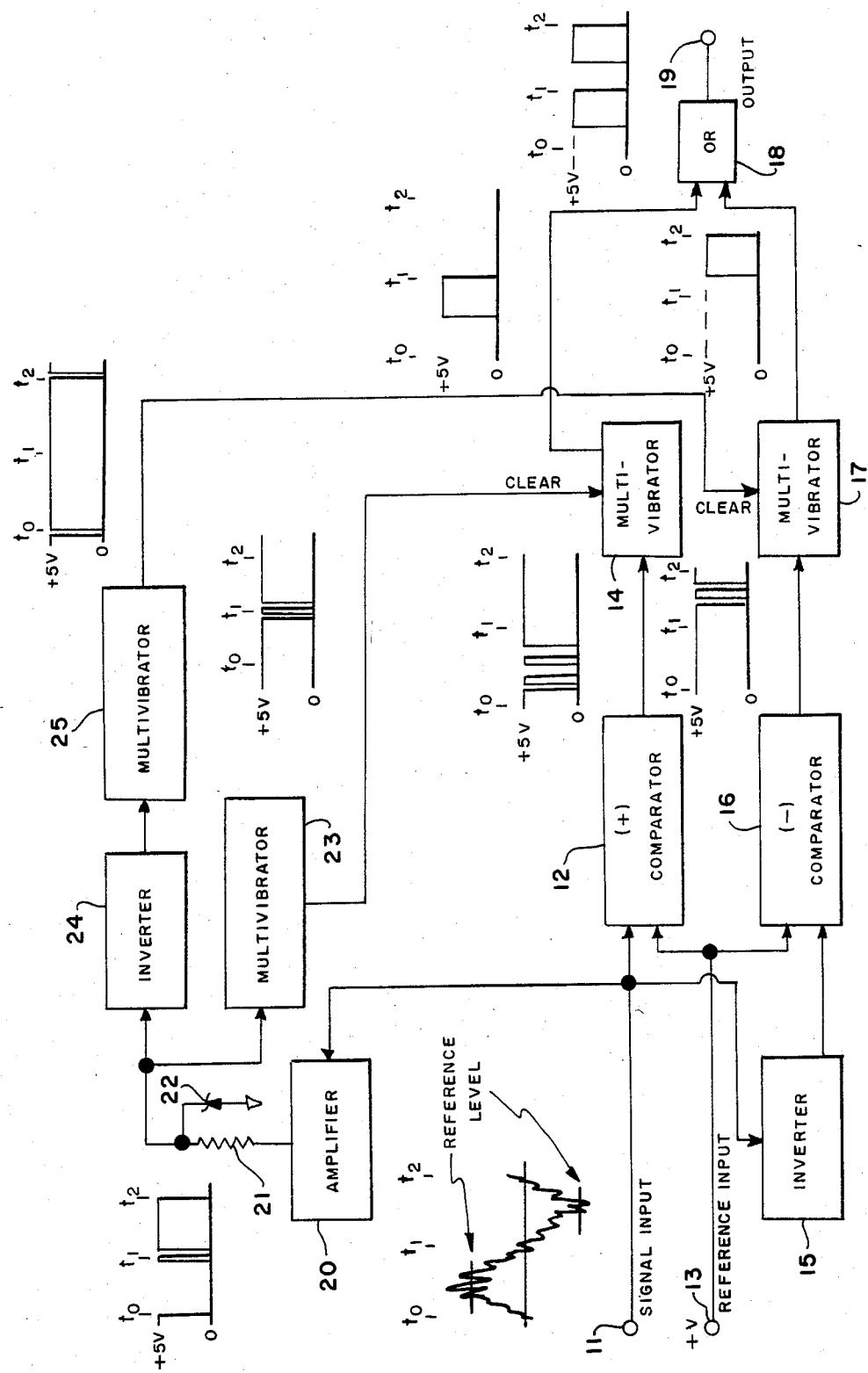

COMPARATOR WITH NOISE SUPPRESSION

ORIGIN OF THE INVENTION

The invention disclosed herein was made by an employee of the United States Government and may be used by or for the Government for governmental purposes without the payment of any royalties therein or therefor.

BACKGROUND OF THE INVENTION

The invention relates generally to electronic comparators and more specifically concerns comparators with noise suppression.

Whenever a model is subjected to tests in a wind tunnel, it will usually vibrate. The vibrations are cyclic and often times sinusoidal about a zero level. It is sometimes necessary to determine how many times the amplitudes of the vibrations exceeds some predetermined reference level during a fixed period of time. To do this in the past, a transducer was placed on the model to produce an electrical signal representing the vibrations. The signals representing vibrations were compared with a reference level with conventional comparator means to produce a pulse each time the signal exceeded the reference level. Whenever the signal exceeded the reference level the comparator output was triggered on and then when the signal dropped below the reference level or a different level the output of the comparator was triggered off thereby resulting in a pulse. The prior art comparators work well except when the signal is noisy: when the input signal is noisy multiple triggering occurs resulting in false counts.

It is therefore an object of this invention to provide a method and apparatus to aid in counting the number of times a noisy cyclic signal representing vibrations exceeds a predetermined reference level during a given period of time.

Another object of this invention is to provide a comparator means for producing a pulse each time a noisy cyclic signal exceeds a reference level and for eliminating any false pulses caused by the noise.

Other objects and advantages will become apparent hereinafter in the specification and drawings.

SUMMARY OF THE INVENTION

In the present invention a noisy cyclic signal is compared with a reference level and each time the signal exceeds the reference level in either the positive or negative half of a cycle of the signal a pulse is produced. Circuitry is provided to assure that at most one pulse is generated during each half-cycle of the signal. Consequently, false pulses are not generated because of the noise accompanying the signal.

BRIEF DESCRIPTION OF THE DRAWING

The sole FIGURE in the drawings is a block diagram of the preferred embodiment of the invention.

DETAILED DESCRIPTION OF THE INVENTION

Turning now to the embodiment of the invention selected for illustration in the drawing, the number 11 designates the terminal to which the input signal is applied. An example of an input signal is shown above terminal 11. Note that the example input signal is a sine wave accompanied with considerable noise. Even though a sine wave is shown, the invention is operable with any cyclic input signal. The purpose of the invention is to accurately determine the number of times the input signal exceeds a reference level excluding the exceedings caused by the noise accompanying the input signal. That is, at most, one exceeding is counted during each half-cycle of the input signal. The input signal is applied to a (+) comparator 12 which produces a fixed level output (+5 volts in the example output shown above the output of comparator 12) as long as the input signal does not exceed the reference level voltage. Whenever the input signal exceeds the reference level voltage the output of comparator 12 drops to zero. Note that for the example input signal the output of comparator 12 changes several times during the positive half-cycle due to the noise. The output of comparator 12 is applied to a multivibrator 14 which is turned on the first time the output of comparator 12 drops from 5 volts to zero volts. While multivibrator 14 is turned on, it produces an output voltage (+5 volts for the example output shown) until a clear pulse is received by the other input terminal of the multivibrator at which time the output drops to zero volts. Consequently, the output of multivibrator 14 is a pulse beginning the first time the signal input exceeds the reference level voltage and terminating when the clear pulse is received.

For the negative part of the cycle of the input signal, the input signal is inverted by an inverter 15 and applied to a (−) comparator 16. Comparator 16 operates the same as comparator 12 in that it produces a voltage level (5 volts) until the signal input exceeds the reference level voltage at which time the output of comparator 16 drops to zero voltage. This drop in voltage turns on a multivibrator 17 which remains on until a clear pulse is received. The resulting pulse along with the pulse from multivibrator 14 are applied to an OR gate 18 to produce both pulses on an output terminal 19. Hence, this invention produces one and only one pulse on the output terminal during each half-cycle of the input signal when the input signal exceeds the reference level voltage during that half-cycle.

To obtain the clear pulses for multivibrators 14 and 17, the input signal is applied to an amplifier 20 whose output is connected through a resistor 21 and a zener diode 22 to ground. While the input signal is positive there is conduction through zener diode 22 thereby making the voltage zero at the junction of resistor 21 and zener diode 22. While the input signal is negative there is no conduction through zener diode 22, hence a voltage will appear at the junction of resistor 21 and zener diode 22. Amplifier 20 operates in a saturation mode such that a fixed voltage (+5 volts for the example shown) will be produced while the input signal is negative. The voltage at the junction of resistor 21 and zener diode 22 is connected to a multivibrator vibrator 23 and through an inverter 24 to a multivibrator 25. Multivibrators 23 and 25 are monostable and turned on by an increasing voltage, thereby supplying the clear pulses for multivibrators 14 and 17, respectively.

The output of multivibrator 14 is set high by the first negative going output pulse of the comparator 12, which indicates the signal input has exceeded the reference level voltage. Subsequent comparator 12 output pulses between $t_0$ and $t_1$ caused by the noise present on the sinusoidal input are ignored by multivibrator 14, since its timing is set with sufficient duration to make it independent of further transitions until it receives an overriding clear pulse. The timing components are selected to provide an output pulse duration ≧ the period $t_1 - t_0$ of the lowest frequency of interest (e.g., if the pulse duration is 0.5 seconds the lowest noise free operation is 1 Hz). The upper limit is typically the upper frequency limit of the amplifiers and comparators.

The high gain amplifier 20 is used in conjunction with multivibrator 23 to provide a clear pulse to multivibrator 14 at the first negative going zero crossing (approximately $t_1$) of the input signal. Once multivibrator 14 is cleared, its output goes to zero volts and it will not be retriggered until the next time a positive input exceeds the reference level voltage. Since the input signal noise at the zero crossing (approximately $t_1$) does not exceed the reference level voltage, it has no effect on multivibrator 14 operation.

The comparator 16 and multivibrator 17 are sensitive to the negative portions of the sinusoidal input signal and respond in the same manner described for the comparator 12 and multivibrator 14.

The advantage of this invention is that it provides a simple, inexpensive method and apparatus for counting the number of times that a cyclic signal exceeds a predetermined reference level without generating false counts due to noise accompanying the signal.

It is to be understood that the disclosed apparatus is a preferred embodiment and changes may be made without departing from the invention. For example, other apparatus than that disclosed might be used to provide the same functions and the disclosed apparatus for providing the clear pulses could be different without departing from the invention.

What is claimed is:

1. A method for preventing multiple triggerings that occur when normal comparators are driven by a noisy cyclic signal that is cyclic about a fixed voltage level comprising the steps of:
    comparing the noisy cyclic signal with a reference voltage level different from the fixed voltage level;
    producing a fixed output voltage level when during a half-cycle of the noisy cyclic signal the noisy cyclic signal first exceeds said reference voltage level;
    generating a clear pulse from the noisy cyclic signal each said half-cycle; and
    stopping the production of said fixed output voltage level using said clear pulse when the noisy cyclic signal next passes the fixed voltage level whereby a single pulse is produced indicating that the noisy cyclic voltage exceeded said reference voltage level during said half-cycle of the noisy cyclic signal.

2. A method for preventing multiple triggerings that occur when normal comparators are driven by a noisy cyclic signal that is cyclic about a zero voltage level comprising the steps of:
    comparing the noisy cyclic signal with a positive reference voltage level;
    producing a fixed output voltage level when during the positive portion of any cycle of the noisy cyclic signal the noisy cyclic signal first exceeds said positive reference voltage;
    generating a clear pulse from the noisy cyclic signal during the positive portion of any cycle of the noisy cyclic signal;
    stopping the production of said fixed output voltage level using said clear pulse generated during the positive portion of any cycle of the noisy cyclic signal when said noisy cyclic signal next passes said zero voltage level;
    inverting the noisy cyclic signal;
    comparing the inverted noisy cyclic signal with said positive reference voltage;
    producing said fixed output voltage level when during the negative portion of any cycle of the noisy cyclic signal the noisy cyclic signal first exceeds said positive reference voltage;
    generating a clear pulse from the noisy cyclic signal during the negative portion of any cycle of the noisy cyclic signal; and
    stopping the production of said fixed output voltage level using said clear pulse generated during the negative portion of any cycle of the noisy cyclic signal when said noisy cyclic signal next passes said zero voltage level, whereby single pulses are produced indicating when said noisy cyclic signal exceeds said reference voltage during the positive and negative portions of said noisy cyclic signal.

3. A comparator apparatus which prevents multiple triggering when driven with a noisy cyclic signal that is cyclic about a fixed voltage level comprising:
    a reference voltage level different from the fixed voltage level;
    a comparator means receiving said reference voltage level and the noisy cyclic signal for producing a fixed output voltage level whenever during a half-cycle of the noisy cyclic signal the noisy cyclic signal first exceeds said reference voltage level;
    means for generating a clear pulse from the noisy cyclic signal each said half-cycle; and
    means for stopping the production of said fixed output voltage level using said clear pulse when said noisy cyclic signal next passes said fixed voltage level, whereby a single pulse is produced indicating that said noisy cyclic signal exceeded said reference voltage level during said half-cycle of the noisy cyclic signal.

4. A comparator apparatus according to claim 3 wherein said comparator means includes a comparator with a multivibrator connected to receive the output from the comparator.

5. A comparator apparatus according to claim 4 wherein said means for stopping the production of said fixed output voltage comprises means for applying said clear pulse to said multivibrator.

6. Apparatus for comparing a noisy cyclic signal that is cyclic about a zero voltage level with a reference level voltage and for producing a single pulse each time the noisy cyclic signal exceeds the reference level voltage during each half-cycle of the noisy cyclic signal comprising:
    a first comparator means receiving the noisy cyclic signal and the reference level voltage for producing a first fixed voltage level output the first time during the positive portion of any cycle of the noisy cyclic signal exceeds the reference level voltage;
    a second comparator means receiving the noisy cyclic signal and the reference level voltage for producing a second fixed level voltage output the first time during the negative portion of any cycle of the noisy cyclic signal exceeds the reference level voltage in the negative direction;
    means generating a first and second clear pulse whenever the noisy cyclic signal crosses the zero voltage level in the positive and negative directions, respectively; and means receiving said first and second clear pulse for stopping the productions of said first and second fixed level voltage output, respectively, whenever the noisy cyclic signal crosses the zero voltage level.

7. Apparatus according to claim 6 wherein said first comparator means includes a first comparator and a first multivibrator.

8. Apparatus according to claim 7 wherein said second comparator means includes an inverter, a second comparator and a second multivibrator.

9. Apparatus according to claim 8 wherein said means for stopping the productions of said first and second fixing level voltage outputs comprises means for applying said first and second clear pulse to said first and second multivibrators, respectively, whenever the noisy cyclic signal passes the zero level voltage in the negative and positive directions, respectively.

10. Apparatus according to claim 9 wherein said means for generating said first and second clear pulse includes an amplifier connected to receive the noisy cyclic signal, a resistor and a zener diode connected in series between the output of said amplifier and ground, a third multivibrator connected to the junction of said resistor and zener diode for supplying said first clear pulse to said first multivibrator, and an inverter and fourth multivibrator connected to the junction of said resistor and zener diode for supplying said second clear pulse to said second multivibrator.

* * * * *